(12) United States Patent
Inoue et al.

(10) Patent No.: US 6,729,532 B2
(45) Date of Patent: May 4, 2004

(54) COMPONENT MOUNTING METHOD

(75) Inventors: Masafumi Inoue, Saga (JP); Yusuke Yamamoto, Fukuoka (JP); Hikaru Onizaki, Fukuoka (JP); Yoichi Yanai, Saga (JP); Yasuhiro Morimitsu, Saga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 165 days.

(21) Appl. No.: 10/037,125

(22) Filed: Oct. 25, 2001

(65) Prior Publication Data

US 2002/0112348 A1 Aug. 22, 2002

(30) Foreign Application Priority Data

Oct. 25, 2000 (JP) ........................ 2000-325322

(51) Int. Cl.[7] ............................ B23K 35/12; H05K 3/34; G06K 9/00
(52) U.S. Cl. ............... 228/254; 228/180.1; 228/180.22; 29/840; 29/842; 29/844; 382/145
(58) Field of Search ............... 228/254, 178, 228/180.1, 180.22, 39; 29/840–844; 382/145–149

(56) References Cited

U.S. PATENT DOCUMENTS

| | | | | |
|---|---|---|---|---|
| 5,656,507 A | * | 8/1997 | Welbourn et al. | 385/14 |
| 6,170,155 B1 | * | 1/2001 | Marion et al. | 29/840 |
| 6,317,513 B2 | * | 11/2001 | Michael et al. | 382/145 |
| 2002/0180962 A1 | * | 12/2002 | Bellm et al. | 356/237.5 |

* cited by examiner

Primary Examiner—L. Edmondson
(74) Attorney, Agent, or Firm—RatnerPrestia

(57) ABSTRACT

A component mounting method for mounting several micro component chips aligned in parallel onto a board by soldering. An allowable offset is set for each electrode, taking into account a self-alignment effect of melted solder in soldering for bonding component terminals onto electrodes formed on the board corresponding to a component layout. Solder printing and component placement onto the electrodes are shifted by the offset. This offset is balanced by the self-alignment effect of melted solder, and each component is secured at an appropriate position. This mounting method allows less stringent spacing conditions to be applied for mounting and prevents the occurrence of defects during printing and placement.

12 Claims, 4 Drawing Sheets

COMPONENT MOUNTING METHOD

FIELD OF THE INVENTION

The present invention relates to a mounting method for mounting, for example, electronic components on a board, and more particularly to a mounting method which reduces the occurrence of defects during high density mounting of micro components.

BACKGROUND OF THE INVENTION

The sizes of electronic components such as semiconductors are continuing to shrink and their mounting density onto a board is rising. For example, a mounting pattern for mounting micro components of about 0.6 mm×0.3 mm in size at a 0.1 mm pitch on a board has already been commercialized. An extremely high degree of accuracy in mounting position is required for mounting components at a high density on a board with this type of narrow-pitch mounting pattern. Accordingly, more accurate placement of components as well as more accurate positioning of electrodes formed on the board need to be assured.

However, the required accuracy cannot be secured when mounting the above-described micro components at a narrow pitch just by improving the accuracy of the electrode position and the component mounting position. For example, a component held with a suction nozzle may interfere with an adjacent mounted component during placement if the component is even slightly off center, obstructing the placement operation. Alternatively, a solder bridge may be formed between solder portions printed on adjacent electrodes before placing components. This may cause short-circuiting between electrodes if reflow is applied to the solder bridge. Accordingly, conventional component mounting methods tend to generate defects when used to mount micro components at very narrow pitches.

SUMMARY OF THE INVENTION

The present invention solves the above disadvantages and aims to offer a component mounting method which reduces defects even when mounting of micro components at a narrow pitch.

The component mounting method of the present invention for mounting components and soldering them onto a board comprises the next steps:

(a) printing solder so as to shift and create a predetermined offset from the center of at least one of the electrodes formed on the board at positions for fixing components when bonding component terminals;

(b) placing components after solder printing in such a way that the placement position is shifted by the above offset with respect to the electrode center position;

(c) moving the components toward the electrode center after placing the components by heating the board to melt the solder; and (d) securing the terminals onto the electrodes at fixing positions after moving the components by solidifying the solder.

The above offset value is normally determined by taking into account the self-aligning effect of melted solder while the electrodes and terminals are being soldered, and is set to an allowable spacing between the terminal position and electrode center when placing the components in the above step (b).

The movement in the above step (c) occurs as a result of the self-alignment effect.

This method allows less stringent spacing conditions to be applied for component placement and prevents the occurrence of defects during printing and mounting by shifting the position by the predetermined offset when printing solder onto the electrode or placing the component on the board.

DETAILED DESCRIPTION OF THE INVENTION

Exemplary embodiments of the present invention are described below with reference to drawings.

First Exemplary Embodiment

A component mounting method of the present invention is typically for mounting micro electronic component chips aligned in parallel at a narrow pitch on a board by soldering.

Figure 1:
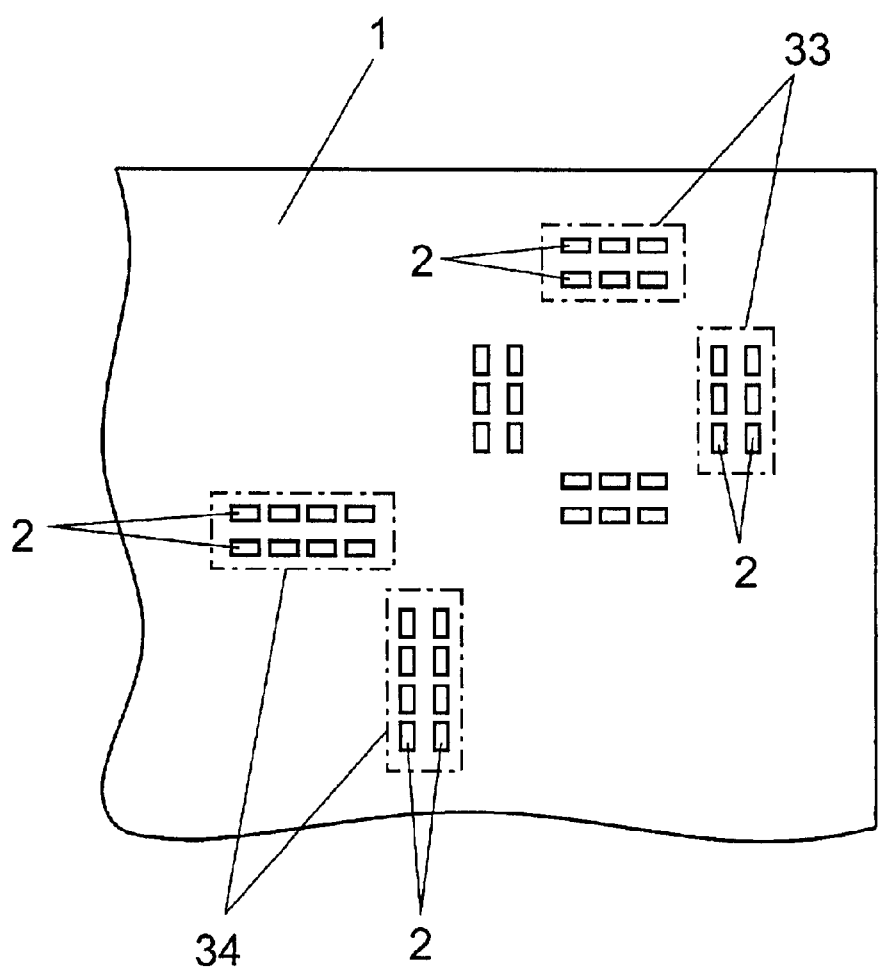
FIG. 1 is a plan view of a board on which components are mounted in accordance with exemplary embodiments of the present invention.

FIG. 1 is a plan view of a board on which components will be mounted in the exemplary embodiment of the present invention.

In FIG. 1, numerous electrodes 2 are formed at positions that correspond to positions for securing components on board 1. Each terminal of the component placed is soldered onto each electrode 2. In the first exemplary embodiment, one chip component 5 (see FIG. 3) is mounted on a pair of (two) opposing electrodes 2.

A pair of electrodes 2 is formed in parallel at a narrow pitch corresponding to each position of several components 5 to be mounted in parallel on board 1. Here, electrodes 2 are disposed on board 1 in two patterns: i) electrode group 33 for mounting three components near to each other, and ii) electrode group 34 for mounting four components near to each other. Micro components 5 of the same size are mounted on each electrode group.

FIGS. 2A and 2B, and FIGS. 3A to 3C are process charts illustrating the component mounting method in the first exemplary embodiment of the present invention. The first exemplary embodiment describes an example of applying the present invention to electrode group 33 in FIG. 1.

Figure 2A:
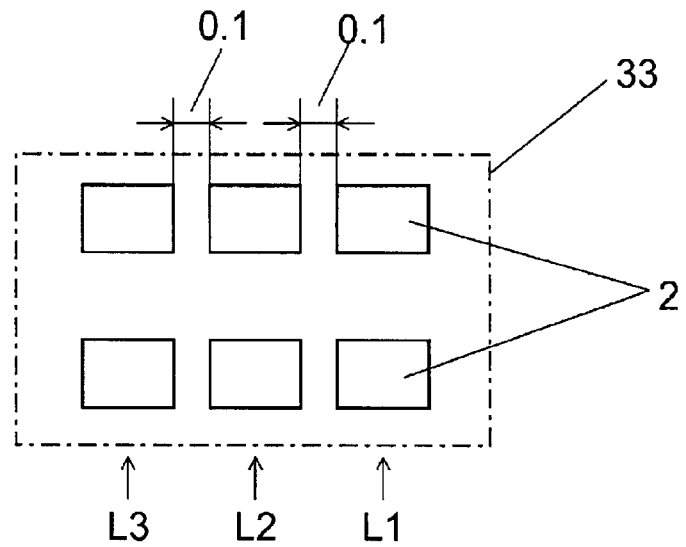
FIGS. 2A and 2B, and FIGS. 3A to 3C are process charts illustrating a component mounting method in accordance with a first exemplary embodiment of the present invention.

FIG. 2A shows a detailed layout of electrodes 2 in electrode group 33 in FIG. 1. Spacing between electrodes in electrode lines L1, L2, and L3, consisting of a pair of electrodes 2, is set to 0.1 mm.

Figure 2B:
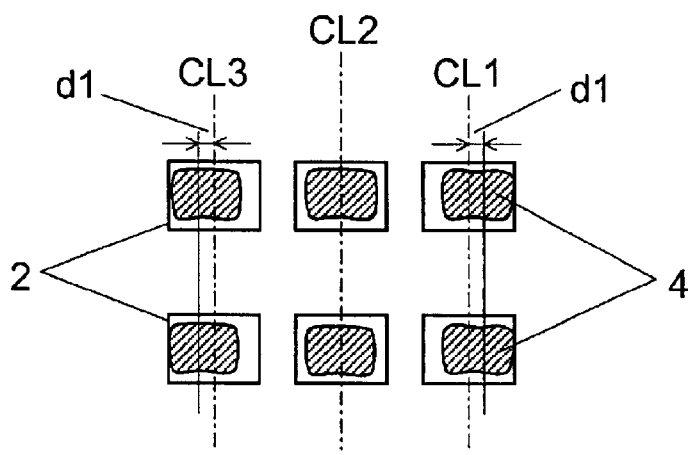

As shown in FIG. 2B, solder paste 4 for bonding components is printed on the top face of each electrode 2. It is apparent that the center of printing positions does not always match center lines CL1, CL2, and CL3 which link the centers of a pair of electrodes forming electrode lines L1, L2, and L3. In other words, solder paste 4 is printed in such a way that only the center of solder paste 4 for middle electrode line L2 in three lines matches the position of center line CL2. For the other two lines on both sides, namely electrode lines L1 and L3, solder paste 4 is printed at a position shifted outward from the center lines CL1 and CL3 for a predetermined offset d1. This offset d1 is set taking into account the self-alignment effect, described later, of melted solder during the soldering process. In the first exemplary embodiment, offset d1 is set to 0.02 mm.

Figure 3A:
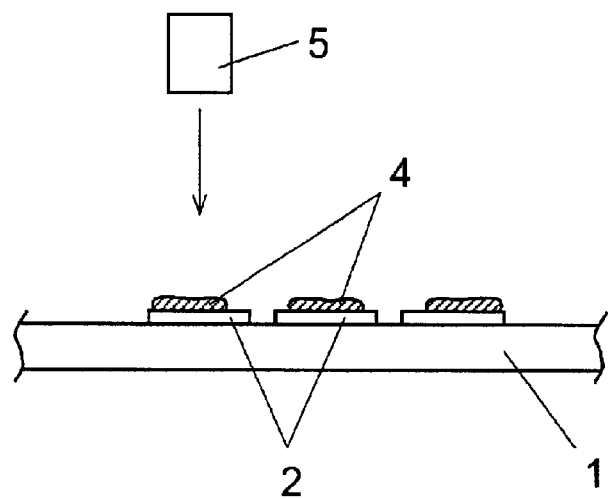
Figure 3B:
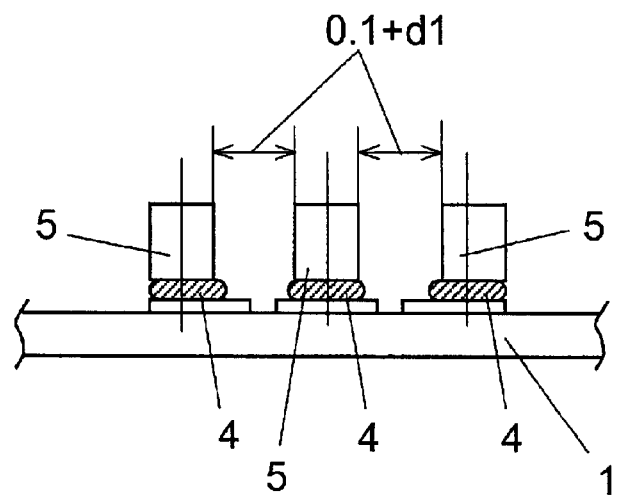

Next, as shown in FIG. 3A, component 5 is placed on electrodes 2 where solder paste 4 is printed. When positioning component 5, the position of component 5 is shifted by the above mentioned offset d1 with respect to the center line for two electrode lines at both sides. In other words, component 5 is positioned to printed solder paste 4, and thus spacing between components at placement is not a predetermined spacing of 0.1 mm but of offset d1 added to 0.1 mm.

Figure 3C:
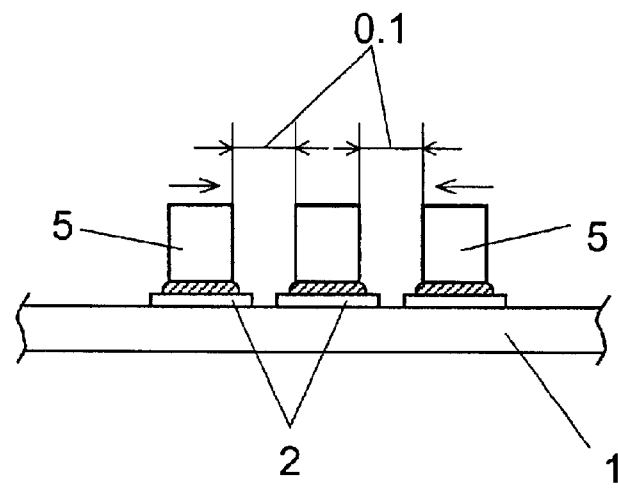

Board 1 on which components 5 are placed in the way described above is sent to the reflow process for heating. The solder content in solder paste 4 melts, and the terminals of components 5 are soldered onto electrodes 2. Melted solder wets and spreads over electrodes 2 during the soldering process, and floats to cover the entire face of electrodes 2. This floating also moves components 5 as described next. As shown in FIG. 3C, components 5, which are positionally shifted by offset d1 at placement, move to the center position of electrodes 2. Components 5 are thus soldered in the correct fixing position on electrodes 2 when the solder solidifies.

The predetermined value of offset d1 is set within a range in which positional deviation is correctable by the self-alignment effect during the soldering process. By shifting the solder printing position and component placement position to create an initial offset, the spacing conditions for placement can be relaxed, reducing the risk of formation of solder bridges during solder printing and component interference during placement. Consequently, defective mounting caused by these factors is preventable.

Second Exemplary Embodiment

Figure 4:
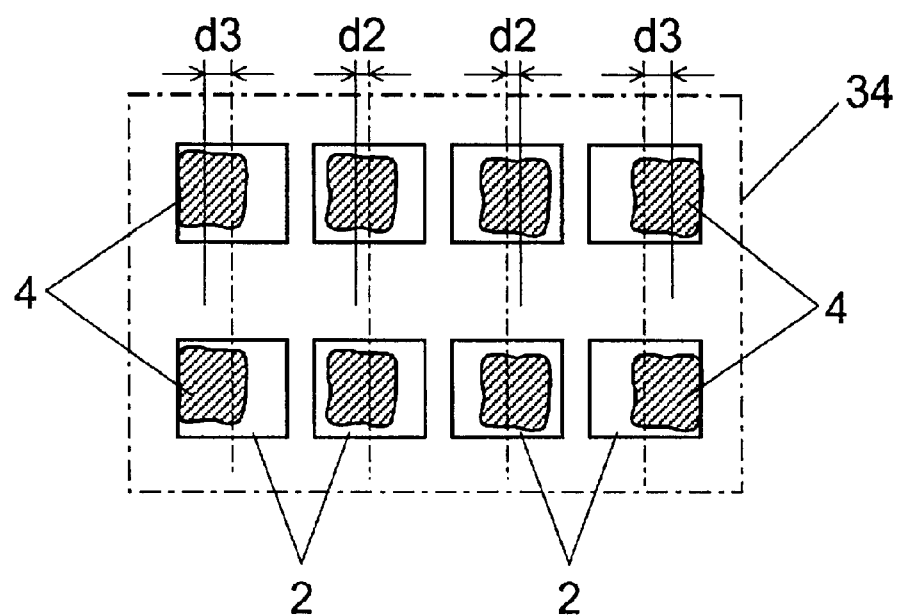
FIG. 4 is an explanatory chart illustrating a component mounting method in accordance with a second exemplary embodiment of the present invention.

FIG. 4 is an explanatory chart illustrating a component mounting method in a second exemplary embodiment of the present invention.

FIG. 4 shows an example of applying the present invention to electrode group 34 in FIG. 1. In the second exemplary embodiment, offset d3 is set for the two outermost lines in four electrode lines. Offset d3 is set within the range allowable by taking into account the self-alignment effect in the soldering process. Next, offset d2 which is equivalent to ½ of the above offset d3 is applied to the two inner lines.

When solder paste 4 is printed on electrode 2, and component 5 is placed on electrode 2, component 5 is shifted outward from the center line of each electrode line by offsets d2 and d3. This allows the spacing during solder printing and component placement to be increased, as in the first exemplary embodiment describing the case of electrode group 33 in FIG. 1, and similarly reducing the risk of formation of solder bridges during solder printing and the occurrence of physical interference between components during placement. Consequently, the occurrence of defects in narrow-pitch mounting of micro components is preventable.

The first and second exemplary embodiments describe the cases of three and four electrode lines. The same effect of reducing the probability of occurrence of defectives is achievable for cases having more electrode lines, by sequentially shifting the printing position and component placement position in each electrode line within the offset range allowable for the outermost lines.

The mounting method of the present invention is also applicable to one or two electrode lines, or even to a single electrode.

As described above, the present invention predetermines an allowable offset for each electrode by taking into account the self-alignment effect in the soldering process for bonding component terminals onto board electrodes. Positions of solder printing and component placement onto electrodes are shifted by that predetermined offset. This enables the relaxing of the spacing limit during placement and prevention of the occurrence of defectives during printing and placement.

What is claimed is:

1. A component mounting method for placing and soldering components onto a board, said method comprising:
   (a) printing solder an electrodes on the board so as to shift and create a predetermined offset of said solder from a center line of at least one at a plurality of electrode lines which are disposed in three parallel lines, said electrode lines being formed in a parallel on the board, at fixing positions said solder for securing said components when bonding respective component terminals, and said center line linking center positions of a pair of electrodes configuring said one of electrode lines;
   (b) placing the component after solder printing so that a placement position is shifted by said offset with respect to the center line of said one of said electrode lines;
   (c) moving said component toward the center line by heating the board to melt the solder after placing the component; and
   (d) securing said component terminal at the center line by solidifying the solder after moving the component wherein said offset is set to a value allowable between the position of said terminal and the center line of said one of said electrode lines when placing the component in said step (b) by taking into account a self-alignment effect of melted solder while soldering of said electrodes and said terminals; and movement in said step (c) occurs as a result of said self-alignment effect.

2. The component mounting method as defined in claim 1, wherein solder for a middle electrode line in said three lines is printed matching a center lint of said middle electrode line.

3. The component mounting method as defined in claim 2, wherein solder for both outer electrode lines in said three lines is printed at a position offset outward from a center line or each of said outer electrode lines.

4. A component mounting method for placing and soldering components onto a board, said method comprising:
   (a) printing solder on electrodes on the board so as to shift and create a predetermined offset of said solder from a center line of at least one of a plurality of electrode lines which are disposed in four parallel lines, said electrode lines being in parallel on the board, said solder for securing said components when bonding respective component terminals, and said center line linking center positions of electrodes configuring said one of electrode lines;
   (b) placing the component after solder printing so that placement position is shifted by said offset with respect to the center line of said one of said electrode lines;
   (c) moving said component toward the center line by heating the board to melt the solder after placing the component; and
   (d) securing said component terminal at the center line by solidifying the solder after moving the component wherein said offset is set to a value allowable between the position of said terminal and the center line of said one of said electrode lines when placing the component in said step (b) by taking into account a self-alignment effect of melted solder while soldering of said electrodes and said terminals; and movement in said step (c) occurs as a result of said self-alignment effect.

5. The component mounting method as defined in claim 4, wherein solder is printed at a position offset outward from a center line at each electrode line in alt of said four lines.

6. A component mounting method for placing and soldering components onto a board, said method comprising:

(a) printing solder on electrodes on the board so as to shift and create a predetermined offset of said solder from each center line of both outer electrode lines of a plurality of electrode lines which are three parallel lines parallel on said board;

(b) placing said component on said solder printed on each electrode in said outer electrode lines so that the placement position is shifted outward by said offset with respect to the center line of each electrode line;

(c) moving said component toward the center line of respective electrode lines by heating the board to melt the solder after placing the component; and (d) securing terminals of said component onto said electrodes by solidifying the solder wherein said offset is set taking into account a self-alignment effect of melted solder while soldering in a reflow process.

7. The component mounting method as defined in claim 6, wherein solder is printed matching a center line of a middle electrode line in said electrode lines.

8. A component mounting method for placing and soldering components onto a board, said method comprising:

(a) printing solder on electrodes on the board so as to shift and create a predetermined offset of said solder from each center line of both outer electrode lines of a plurality of electrode lines which are four parallel lines parallel on said board;

(b) placing said component on said solder printed on each electrode in said outer electrode lines so that the placement position shifted outward by said offset with respect to the center line of each electrode line;

(c) moving said component toward the center line of respective electrode lines by heating the board to melt the solder after placing the component; and (d) securing terminals of said component onto said electrodes by solidifying the solder wherein said offset is set taking into account a self-alignment effect of melted solder while soldering in a reflow process.

9. The component mounting method as defined in claim 8, wherein solder is printed at a position offset outward from a center line of each electrode line in all of said four electrode lines.

10. The component mounting method as defined in claim 9, wherein an offset set for two inner electrode lines in said four electrode lines is smaller than an offset set for two outer electrode lines.

11. A component mounting method according to claim 1, wherein said three parallel lines are three of five or more parallel lines.

12. A component mounting method according to claim 6, wherein said three parallel lines are three of five or more parallel lines.

* * * * *

UNITED STATES PATENT AND TRADEMARK OFFICE
CERTIFICATE OF CORRECTION

PATENT NO. : 6,729,532 B2
DATED : May 4, 2004
INVENTOR(S) : Masafumi Inoue et al.

It is certified that error appears in the above-identified patent and that said Letters Patent is hereby corrected as shown below:

Column 4,
Line 15, the second occurrence of "at" should read -- of --.
Line 39, "lint" should read -- line --.

Column 5,
Line 7, "at" should read -- of --.
Line 7, "alt" should read -- all --.
Line 28, between "said" and "electrode", insert -- three --.

Column 6,
Line 6, between "position" and "shifted", insert -- is --.

Signed and Sealed this

Thirtieth Day of November, 2004

JON W. DUDAS
*Director of the United States Patent and Trademark Office*